(12) United States Patent
Cai

(10) Patent No.: US 10,324,574 B2
(45) Date of Patent: Jun. 18, 2019

(54) TOUCH SENSOR AND FABRICATING METHOD THEREOF AND TOUCH DISPLAY PANEL

(71) Applicant: SHANGHAI TIANMA MICRO-ELECTRONICS CO., LTD., Shanghai (CN)

(72) Inventor: Yu Cai, Shanghai (CN)

(73) Assignee: SHANGHAI TIANMA MICRO-ELECTRONICS CO., LTD., Shanghai, P.R. (CN)

( * ) Notice: Subject to any disclaimer, the term of this patent is extended or adjusted under 35 U.S.C. 154(b) by 0 days.

(21) Appl. No.: 15/694,492

(22) Filed: Sep. 1, 2017

(65) Prior Publication Data
US 2018/0011568 A1  Jan. 11, 2018

(30) Foreign Application Priority Data

Jan. 3, 2017  (CN) .......................... 2017 1 0002011

(51) Int. Cl.
| | |
|---|---|
| *G06F 3/041* | (2006.01) |
| *G06F 3/044* | (2006.01) |
| *H01L 51/52* | (2006.01) |
| *H01L 27/32* | (2006.01) |
| *H01L 51/00* | (2006.01) |

(52) U.S. Cl.
CPC ............ *G06F 3/044* (2013.01); *G06F 3/0412* (2013.01); *H01L 27/32* (2013.01); *H01L 51/5253* (2013.01); *G06F 2203/04102* (2013.01); *G06F 2203/04103* (2013.01); *G06F 2203/04111* (2013.01); *G06F 2203/04112* (2013.01); *H01L 27/323* (2013.01); *H01L 27/3244* (2013.01); *H01L 51/0022* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

2014/0295127 A1* 10/2014 Tang ...................... G06F 3/044
428/67

FOREIGN PATENT DOCUMENTS

CN    104425085 A    3/2015

* cited by examiner

Primary Examiner — Nicholas J Lee
(74) Attorney, Agent, or Firm — Alston & Bird LLP

(57) ABSTRACT

An embodiment of the present disclosure provides a touch sensor, comprising: a substrate and a touch electrode, where touch sensor includes a first surface and a second surface opposite to the first surface, the first surface of the substrate is provided with a plurality of grooves which are strip-shaped, the plurality of grooves intersect with other to define a grid shape, the plurality of grooves comprise intersection regions and extension regions, a vertical distance from the intersection region to the second surface is greater than a vertical distance from the extension region to the second surface, and the bottom of the plurality of grooves does not exceed the first surface; and the touch electrode is filled in the groove.

17 Claims, 20 Drawing Sheets

TOUCH SENSOR AND FABRICATING METHOD THEREOF AND TOUCH DISPLAY PANEL

CROSS-REFERENCES TO RELATED APPLICATIONS

This application claims priority to a Chinese patent application No. CN201710002011.7 filed on Jan. 3, 2017 and entitled "TOUCH SENSOR AND FABRICATING METHOD THEREOF AND TOUCH DISPLAY PANEL", the disclosure of which is incorporated herein by reference in its entirety.

TECHNICAL FIELD

The present disclosure relates to the field of display technologies, and more particularly, to a touch sensor and a fabricating method thereof and a touch display panel.

BACKGROUND

At present, to realize a touch function of a flexible display panel of an organic light-emitting diode, it is generally required to laminate one layer touch module on the display panel, increasing the flexible display panel thickness. To realize the light weight and slim design of a touch-type flexible display panel, an integrated technology is used to replace the traditional module laminating technology.

The existing integrated technologies mainly are classified into the following two types. Type one: a touch electrode is integrated into a protective film layer, a polarizer or a glass cover plate. This technique is usually used for fabrication of the protective film layer, the polarizer and the glass cover plate, instead of thinning a flexible display product to a certain thickness.

Type two: a touch electrode is integrated onto the surface of a thin-film encapsulation layer. The touch electrode needs photoetching and wet etching processes in this case. However, a yellow light exposure effect and photoetching process can damage the light-emitting layer of an organic light-emitting display panel, while acidic or alkali chemical liquid in the wet process may easily damage each of the film layers in the thin-film encapsulation layer.

SUMMARY

The present disclosure provides a touch sensor, a touch display panel, and a fabricating method thereof to reduce a manufacturing process difficulties for making the touch sensor, in order to enhance a connection reliability of the touch electrode, and to effectively avoid damaging. The disclosure includes an inventive touch electrode fabricating process, and materials of a thin-film encapsulation layer and materials of a light-emitting element in an organic light emitting display panel, thereby improving an operational reliability of the organic light emitting display panel.

In a first aspect, an embodiment of the present disclosure provides a touch sensor, including: a substrate, the substrate includes a first surface and a second surface opposite to the first surface. The first surface of the substrate is provided with a plurality of grooves which are strip-shaped, and the plurality of grooves intersect with each other to define a grid shape.

The groove includes intersection regions and extension regions. A vertical distance from of a bottom of the intersection region to the second surface is greater than a vertical distance from a bottom of the extension region to the second surface.

The bottom of the plurality of grooves is does not exceed the first surface.

The touch electrode is filled in the plurality of grooves.

In a second aspect, an embodiment of the present disclosure further provides a touch display panel, and the touch display panel includes the touch sensor mentioned above.

In a third aspect, an embodiment of the present disclosure further provides a method for fabricating a touch sensor, including: forming a substrate, where the substrate includes a first surface and a second surface opposite to the first surface;

forming a plurality of grooves on the first surface of the substrate, where the plurality of grooves are intersected with each other to define a grid shape;

the plurality of grooves include intersection regions and extension regions;

a vertical distance from a bottom of the intersection region to the second surface is greater than a vertical distance from a bottom of the extension region to the second surface, and the bottom of the plurality of grooves does not exceed the first surface; and forming a touch electrode, where the touch electrode is filled in the plurality of grooves.

Embodiments of the present disclosure provide a touch sensor and a fabricating method thereof and a touch display panel. A plurality of grooves are disposed on the substrate of the touch sensor, and a vertical distance from a bottom of the intersection region to the second surface is greater than a vertical distance from a bottom of the extension region to the second surface. Such a setting pattern may enhance a fluidity of touch electrode material solution in the groove when the touch electrode is formed by way of inkjet printing, ensure the touch electrode to be formed evenly and stably, implement a better control of forming of the touch electrode, reduce a difficulty in fabricating the touch electrode, enhance a process stability of the touch electrode, allow the touch electrode to be evenly spread in the groove, and greatly reduce a possibility of disconnection of the touch electrode, thereby improving a touch reliability of the touch electrode.

DETAILED DESCRIPTION OF THE EMBODIMENTS

Figure 1A:
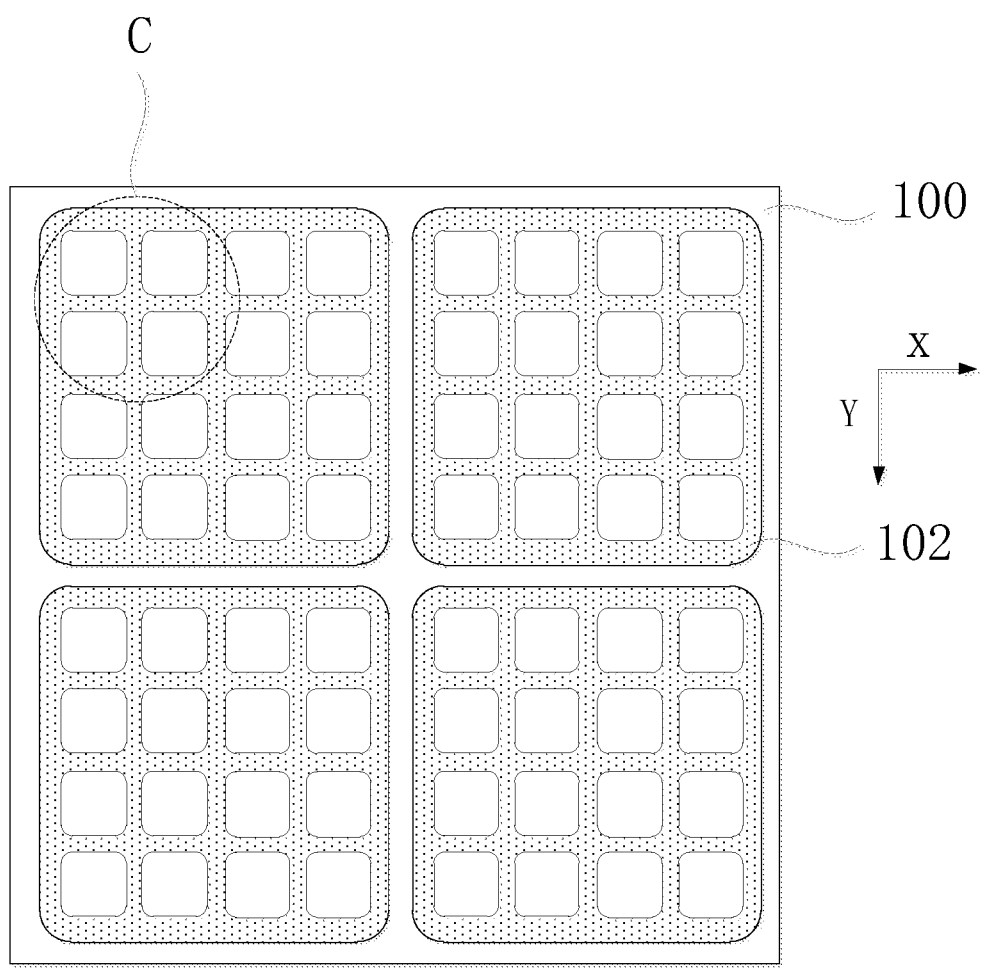
FIG. 1A is a top view of a touch sensor according to an embodiment of the present disclosure.

The present disclosure is further described in detail in the following with reference to the accompanying drawings and embodiments. It is to be understood that the embodiments set forth herein are merely intended to interpret the present disclosure instead of limiting the present disclosure. In addition, it is also to be noted that for ease of description, drawings merely show parts related to the present disclosure instead of all parts. Furthermore, the same reference numeral is used in different accompanying drawings to give a clearer description.

An embodiment of the present disclosure provides a touch sensor, the touch sensor includes a substrate and a touch electrode, where the substrate includes a first surface and a second surface opposite to the first surface. The first surface of the substrate is provided with a plurality of grooves which are strip-shaped, and the plurality of grooves intersect with each other to define a grid shape. The plurality of grooves include intersection regions and extension regions, a vertical distance from a bottom of the intersection region to the second surface is greater than that a vertical distance from a bottom of the extension region to the second surface.

The bottoms of the plurality of grooves do not the first surface.

And the touch electrode is filled into the plurality of grooves.

Generally, the touch electrode of the touch sensor is directly formed on the surface of the substrate of the touch sensor. The material of the touch electrode includes transparent indium tin oxide. However, in a flexible display panel, a metal grid electrode having good flexibleness and low impedance may be used so as to enhance the bending resistance of the touch electrode. The fabricating process of the metal grid may adopt a technique of screen printing directly using metal ink. Alternatively, the entire metal may be coated on the substrate thin film and then redundant components are washed away via a yellow light photolithography process to generate the grid. No matter which technique is used, the above techniques may cause a negative impact on the light-emitting element if the metal grid electrode is directly formed inside the organic light emitting display panel.

In the embodiments of the present disclosure, the touch electrode is formed in the groove on the substrate by means of inkjet printing, electrode material of the touch electrode may be metal, the electrode material of the touch electrode is dissolved into organic solvent to form electrode material solution of the touch electrode, then the electrode material solution is jetted and printed into the groove of the substrate. Liquid entering into the groove rapidly flows along an inner wall of the groove to form a uniform electrode shape, and then is cured, and the organic solvent olatilizevaporizes. In this way, the touch electrode is formed. In the embodiments of the present disclosure, the vertical distance of a bottom of the groove from the intersection region to the second surface is greater than that of the bottom of the groove from the extension region to the second surface. The electrode material solution drips at the intersection region and flows to the extension region so that the electrode material solution is caused to be uniformly spread in the groove, thereby regulating and controlling the flow rate and uniformity of spreading of the electrode material solution in the groove, ensuring the uniformity of the formed touch electrode, reducing a possibility of disconnection of the touch electrode, allowing each touch electrode to have uniform impedance and improving a touch performance of the touch sensor. It is to be noted that the intersection region in the embodiments of the present disclosure is a region formed by intercrossing two or more strip-shaped grooves, and the extension region is a region of the groove beyond the intersection region.

Figure 1B:
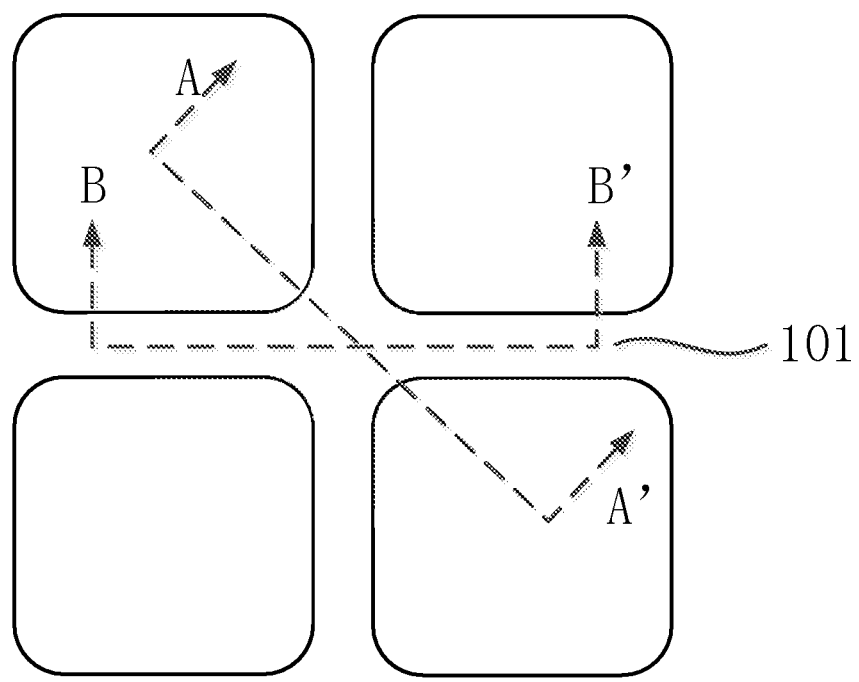
FIG. 1B is an enlarged drawing of a groove in area C of FIG. 1A.
Figure 1C:
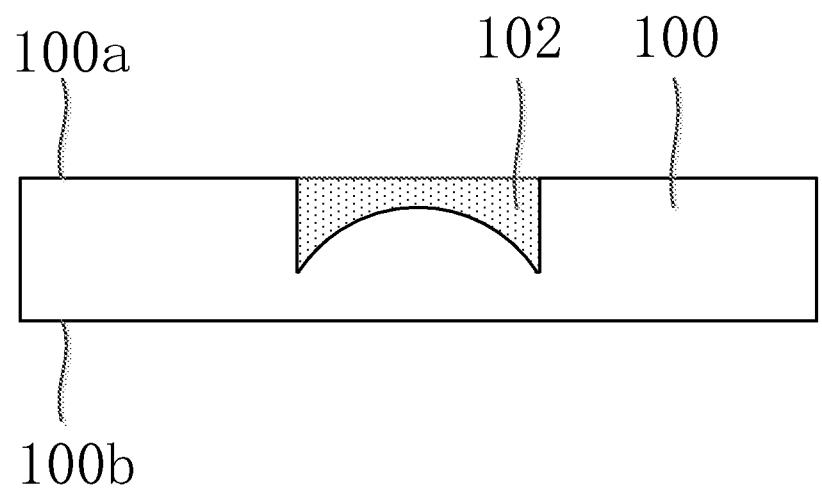
FIG. 1C is a cross sectional view along AA' of FIG. 1B.
Figure 1D:
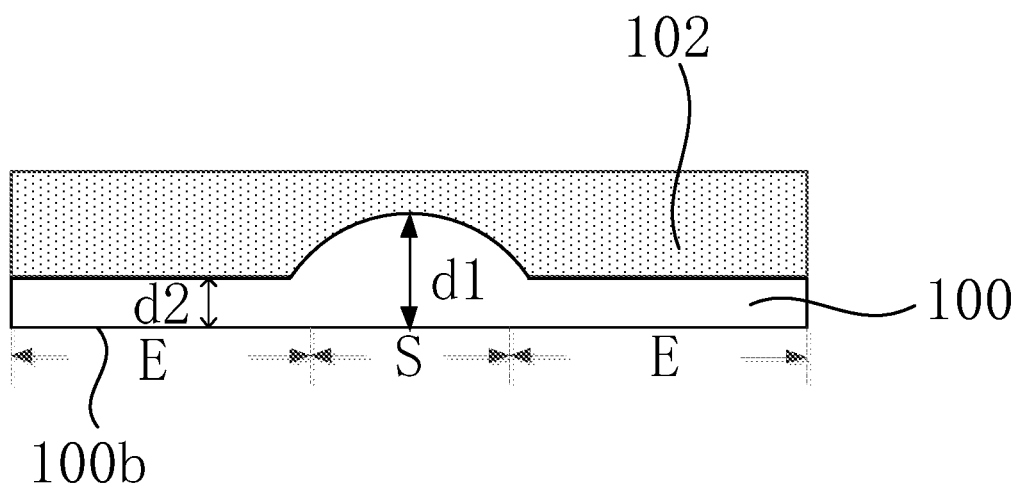
FIG. 1D is a cross sectional view taken along BB' of FIG. 1B.

The embodiments of the present disclosure will be described in detail in the following with reference to the accompanying drawings. FIG. 1A is a top view of a touch sensor according to an embodiment of the present disclosure, FIG. 1B is a partial enlarged drawing of a groove at C in FIG. 1A, FIG. 1C is a sectional view taken along AA of FIG. 1B, and FIG. 1D is a sectional view taken along BB of FIG. 1B. It is to be noted that the touch electrode is omitted in FIG. 1B to more clearly show the technical solutions of the embodiments of the present disclosure. As shown in FIG. 1A~FIG. 1D, the touch sensor includes a substrate 100 which has a first surface 100a and a second surface 100b opposite to the first surface 100a. The first surface 100a of the substrate 100 is provided with a plurality of grooves 101 which are strip-shaped, and the plurality of grooves are intersected with each other to define a grid shape. A touch electrode 102 is filled in the groove 101. Therefore, the touch electrodes filled in the plurality of intersected grooves are electrically connected with each other to form a touch electrode for detecting a touch position. The intersection of the grooves 101 is related to shapes of the required touch electrodes. As shown in FIG. 1A, five grooves extending along a first direction X and five grooves extending along a second direction Y are intersected to form the shape of a touch electrode for position detection. However, the present disclosure neither limits the shape formed by intersecting the grooves, nor limits the number of the intersected grooves. The touch electrode 102 may be a self-capacitive touch electrode, or may be a mutual-capacitive touch electrode. When the touch electrode 102 is the mutual-capacitive touch electrode, the touch electrode 102 includes a touch drive electrode and a touch detection electrode to implement detection of the touch position, which is not limited in the present disclosure.

The plurality of grooves 101 include intersection regions S and extension regions E. A distance d1 from a bottom of the intersection region to the second surface is greater than a distance d2 from a bottom of the extension region to the second surface. In the embodiments of the present disclosure, referring to FIG. 1C, the bottom of the plurality of grooves 101 does not exceed the first surface 100a to ensure flatness and electrical connectivity of the formed touch electrode.

The structure of the touch sensor provided by the embodiments of the present disclosure has obvious advantages in the technology of forming the touch electrode by means of ink-jet printing. Before forming the touch electrode 102, a plurality of grooves 101 are formed on the first surface of the substrate 100. A grid shape formed by crossing the plurality of grooves 101 defines the shape of the touch electrode 102. The touch electrode 102 is formed in the groove 101, which can reduce the thickness of the touch sensor so as to reduce the whole thickness of a touch display panel including the touch sensor, thereby providing a user with better user experience. In another aspect, before forming the touch electrode in the groove, the electrode material of the touch electrode is dissolved into an organic solvent to form electrode material solution. The electrode material solution is jetted and printed into the intersection region of the groove. The vertical distance of the bottom of the groove from the intersection region to the second surface is greater than that of the bottom of the groove from the extension region to the second surface, which is favorable for the flow of the electrode material solution from the intersection region to the extension region of the groove, thereby accelerating a flow rate of the electrode material solution in the groove. On one hand, mass producibility of the technology is improved. On the other hand, uniformity in spreading the touch electrode is enhanced, thereby preventing the formed touch electrode from disconnecting and preventing from having a negative effect on touch stability of the touch sensor.

Figure 2:
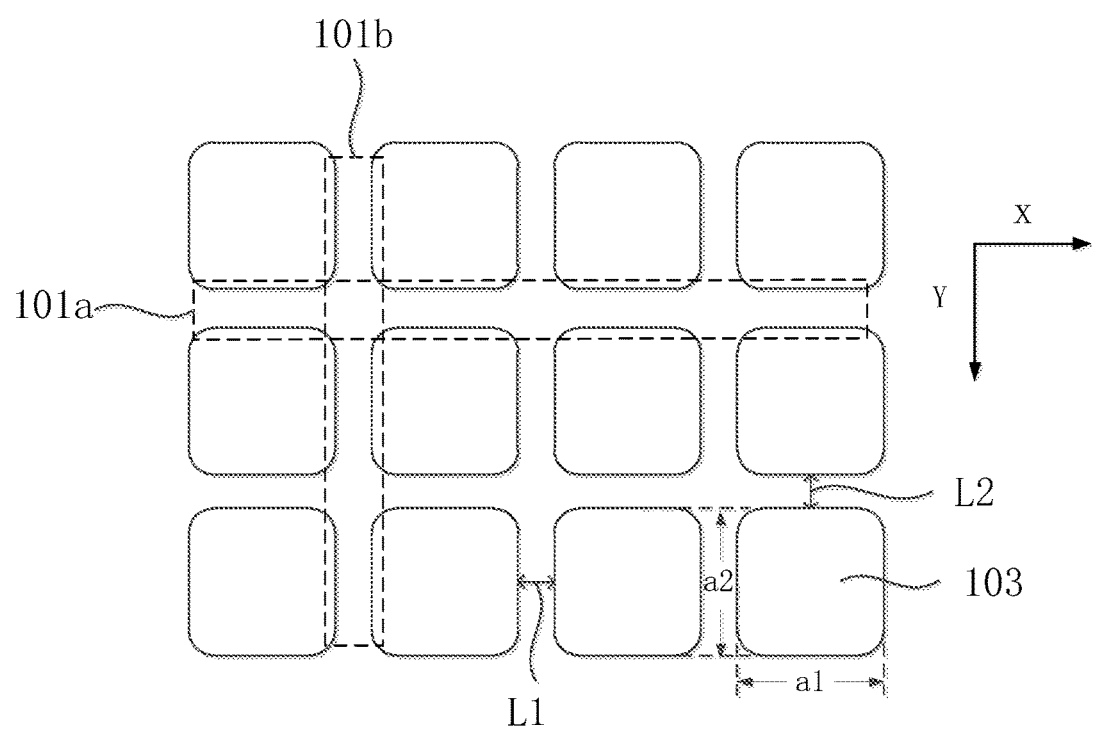
FIG. 2 is a schematic diagram of grooves according to an embodiment of the present disclosure.

FIG. 2 is a schematic diagram of a groove according to an embodiment of the present disclosure. As shown in FIG. 2, the groove 101 includes a first groove 101a extending along a first direction X and a second groove 101b extending along a second direction Y. A plurality of first grooves 101a and a plurality of second grooves 101b intersected to define a quadrilateral region 103. The quadrilateral region 103 has a first width a1 along the first direction X and a second width a2 along the second direction Y. A first distance L1 is set between the adjacent quadrilateral regions 103 on the first surface in the first direction X, and a second distance L2 is set between the adjacent quadrilateral regions on the first surface in the second direction Y.

The groove 101 in the embodiments of the present disclosure is divided into a first groove 101a and a second groove 101b. The first groove 101a extends along the first direction X, and the second groove 101b extends along the second direction Y. A quadrilateral region is defined by transversely and longitudinally intersecting the first groove with the second groove. Such an arrangement is advantageous to fabrication of the first groove and the second groove. Optionally, the first width a1 may be equal to the second width a2, both of which are equal to a. that is, the quadrilateral region has a square shape. The first distance L1 may be equal to the second distance L2, both of which are equal to L. actually, the first distance and the second distance respectively are the widths of the second groove 101b and the first groove 101a on the first surface. Since the touch electrode is formed within the groove, when the first distance L1 is equal to the second distance L2, this is advantageous to a constant impedance design of the touch electrode, thereby improving the touch performance of the touch sensor.

Figure 3A:
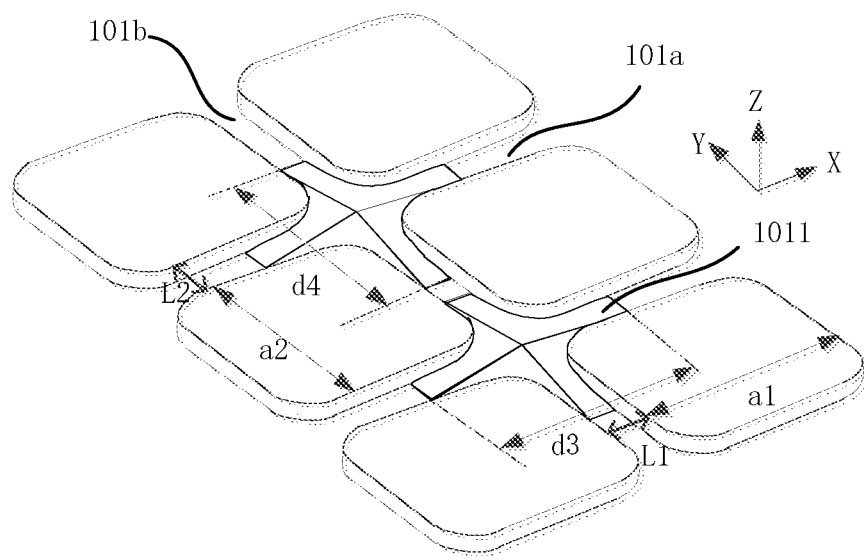
FIG. 3A is a schematic diagram showing the spatial structure of a groove according to an embodiment of the present disclosure.
Figure 3B:
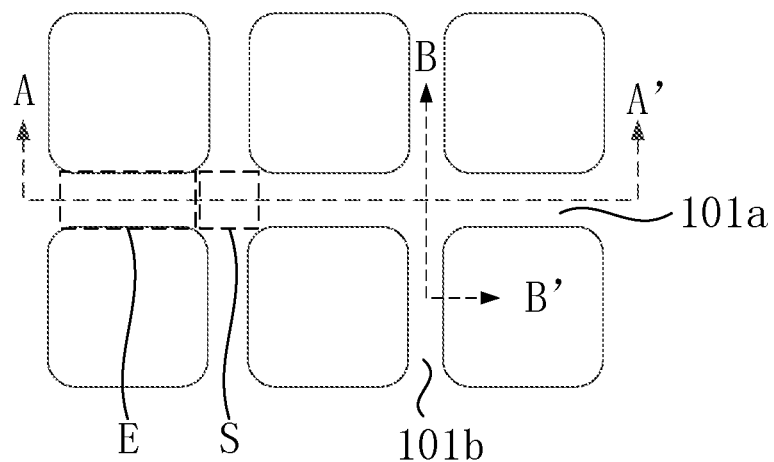
FIG. 3B is a top view of FIG. 3A.
Figure 3C:
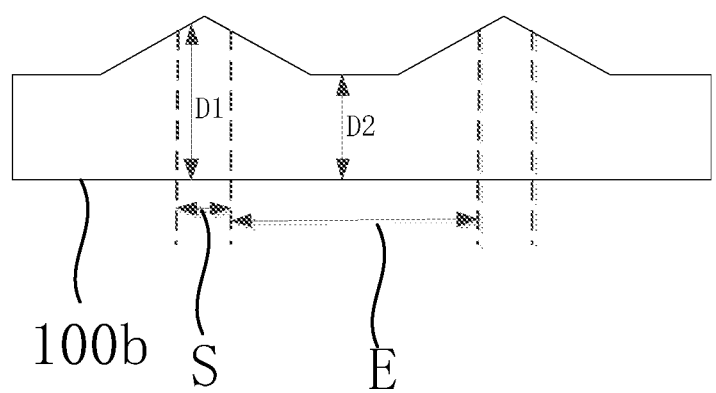
FIG. 3C is a cross sectional view taken along AA' of FIG. 3B.

FIG. 3A is a schematic diagram showing the spatial structure of a groove according to an embodiment of the present disclosure, FIG. 3B is a top view of FIG. 3A, and FIG. 3C is a sectional view taken along AA of FIG. 3B. Referring to FIG. 3A~FIG. 3C, at the intersection region S, the bottom of the groove 101 has a protrusion protruded toward the first surface 100a. The protrusion has an inclined portion 1011 extending toward the extension region E, and the height of the inclined portion 1011 gradually decreases from the intersection region S to the extension region E. As shown in FIG. 3B, at the intersection region S, the bottom of the groove 101 has a protrusion protruded toward the first surface 100a to form the inclined portion 1011, so that a height difference is formed between the bottom of the groove at the intersection region S and the bottom of the groove at the extension region E. The height of the inclined portion 1011 gradually decreases from the intersection region S to the extension region E. As shown in FIG. 3C, D1>D2, the inclined portion extends from the intersection region S to the extension region E, and the gradually decreased height can allow the electrode material solution dripping from the intersection region to flow to the extension region under the action of gravity, so that the electrode material solution dripping from the intersection region is uniformly spread to form the touch electrode 102. In this way, the complexity in fabricating the touch electrode is reduced.

Continuously referring to FIG. 3A, the number of the inclined portions 1011 is four, and the four inclined portions 1011 respectively extend toward the first groove 101a located at two ends of the intersection region S and extend toward the second groove 101b located at two ends of the intersection region S. It is to be noted that the number of the inclined portions being four means that the number of the inclined portions extending outward from one intersection region is four, and the four inclined portions 1011 respectively extend toward two ends of the first groove 101a and the second groove 101b that define the intersection region S. The inclined portion 1011 can guide the electrode material solution to quickly spread to the extension region. It is to be noted that the shape of the inclined portion as shown in FIG. 3A is merely exemplary. It is within the scope of protection of the embodiments of the present disclosure as long as the height of the inclined portion gradually decreases from the intersection region S to the extension region E.

Figure 4A:
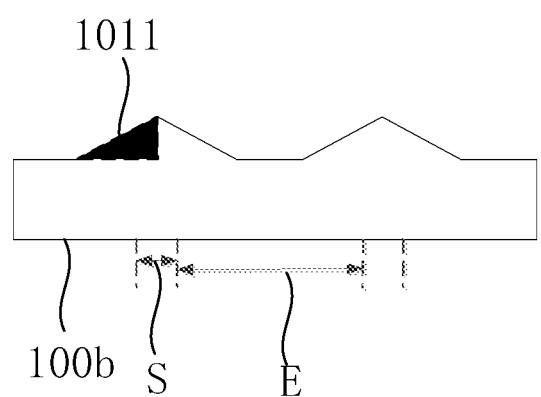
FIG. 4A~FIG. 4C are schematic cross sectional diagrams of three types of grooves along AA' of FIG. 3B according to the embodiments of the present disclosure.
Figure 4B:
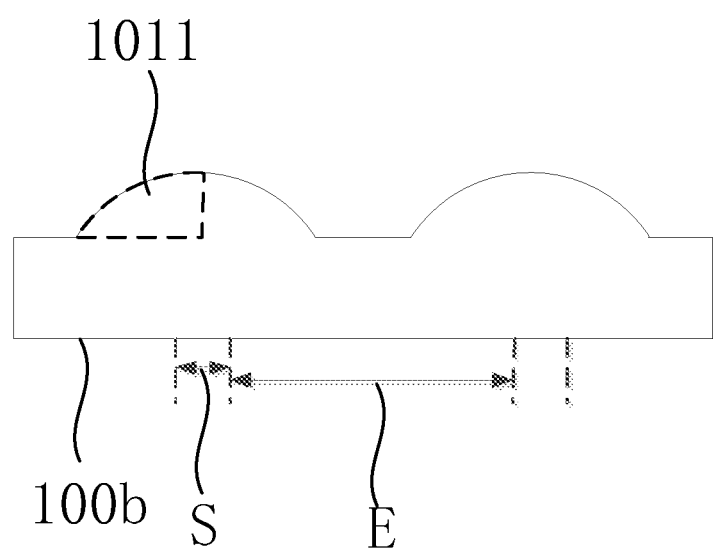
Figure 4C:
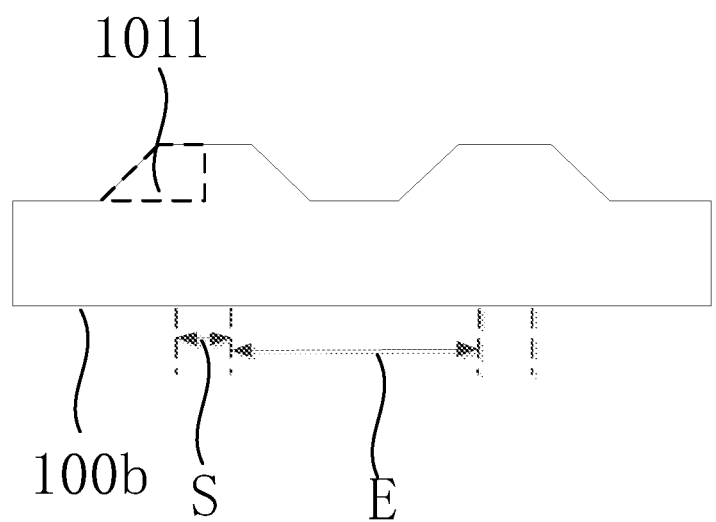

FIG. 4A~FIG. 4C are schematic sectional diagrams of three grooves according to the embodiments of the present disclosure, and FIG. 4A~FIG. 4C are sectional diagrams of the grooves in the X-Z plane or in the Y-Z plane of FIG. 3A Referring to FIG. 4A~FIG. 4C, in the first direction or the second direction, the cross-section of the inclined portion 1011 perpendicular to the first surface has a triangle shape, a trapezoid shape or an arc shape. FIG. 4A shows that the cross-section of the inclined portion 1011 has a triangle shape; FIG. 4B shows that the cross-section of the inclined portion 1011 has a trapezoid shape; and FIG. 4C shows that the cross-section of the inclined portion 1011 has an arc shape. The shapes of the cross-section of the triangle, the trapezoid and the arc allow a flow force subject to the droplets of the electrode material solution to have a relatively large component in a gravity direction, which facilitates the droplets of the touch electrode solution to flow from the intersection region S to the extension region E.

Continuously referring to FIG. 3A, the inclined portion 1011 extends from the intersection region to the extension region. The sum d3 of maximum lengths, in the first direction X, of two inclined portions extending toward the first groove 101a is less than or equal to the sum of the first width a1 and the first distance L1. The sum d4 of maximum lengths, in the second direction Y, of two inclined portions extending toward the second groove 101b is less than or equal to the sum of the second width a2 and the second distance L2. The length of one inclined portion 1011 in the embodiments of the present disclosure may be defined as the distance from a center of the intersection region to a position at which the height of the inclined portion extending toward the extension region does not decrease any more. It is to be understood that the maximum distance between two adjacent intersection regions in the first direction is the sum of the first width and the first distance, and the maximum distance between two adjacent intersection regions in the second direction is the sum of the second width and the second distance. When the sum d3 of the maximum lengths, of two inclined portions extending toward the first groove 101a, in the first direction X is equal to the sum of the first width a1 and the first distance L1, there will be no flat region at the bottom of the first groove 101a extending in the first direction. When the sum d4 of the maximum lengths, of two inclined portions extending toward the second groove 101b, in the second direction Y is less than or equal to the sum of the second width a2 and the second distance L2, there will be no flat region at the bottom of the second groove 101b extending in the second direction. Liquid droplets of the electrode material solution have the best fluidity by using self gravity.

Figure 5:
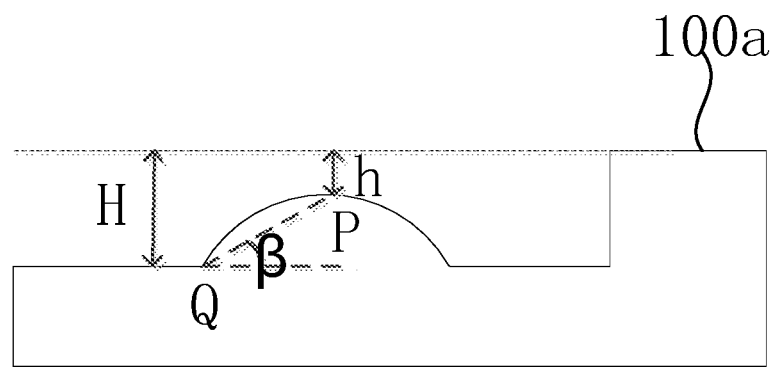
FIG. 5 is a cross sectional view taken along BB' of FIG. 3B.

FIG. 5 is a sectional view taken along BB of FIG. 3B, as shown in FIG. 5, the inclined portion 1011 has a first apex P nearest to the first surface 100a and a first low point Q farthest from the first surface 100a. An inclination β between a connecting line from the first apex P to the first low point Q and the first surface 100a is, the vertical distance from the first apex P to the first surface is h; and the maximum vertical distance from the first surface 100a to the bottom of the groove is H, wherein, when 0≤h≤H/2, the β satisfies with: β≤arctan(2(H−h)/(a+L)).

It is to be understood that the bottom of the groove does not exceed the first surface 100a, and the bottom of the groove has a protrusion protruded toward the first surface 100a to form the inclined portion 1011 extending toward the extension region. The height of the inclined portion 1011 gradually decreases from the intersection region to the extension region. At the intersection region, the inclined portion 1011 has a first apex P nearest to the first surface. When the vertical distance h from the first apex P to the bottom of the groove satisfies with 0≤h≤H/2, the inclination β between the connecting line from the first apex P to the first low point Q and the first surface 100a cannot be greater than arctan(2(H−h)/(a+L)). When the inclination β is smaller than arctan(2(H−h)/(a+L)), the inclined portion can farthest extend toward the extension region, which not only allows the electrode material solution dripping from the intersection region to have good fluidity in the groove, but also prevents the touch electrode from breaking due to a too large angle of the inclined portion.

Figure 6A:
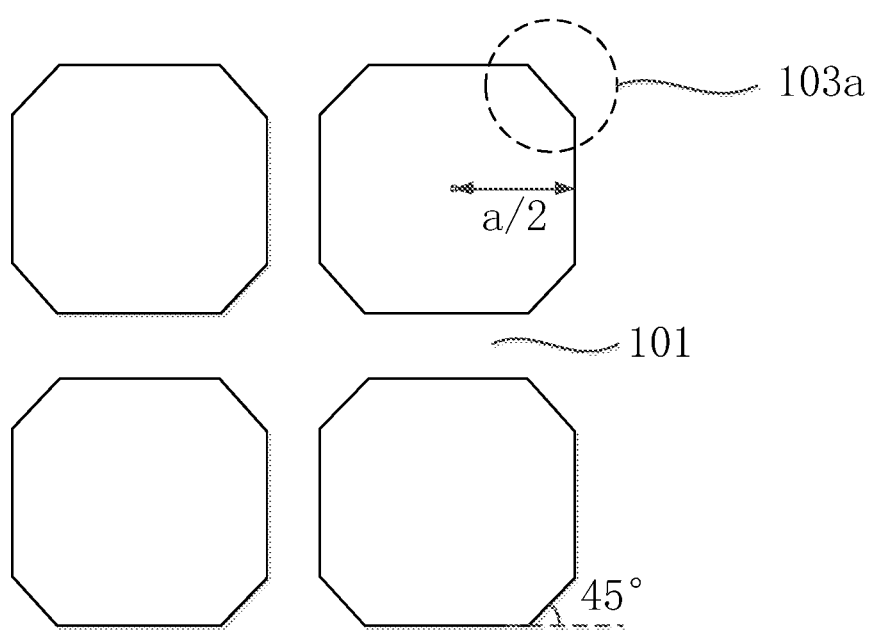
FIG. 6A and FIG. 6B respectively are schematic diagrams of two types of quadrilateral regions according to the embodiments of the present disclosure.
Figure 6B:
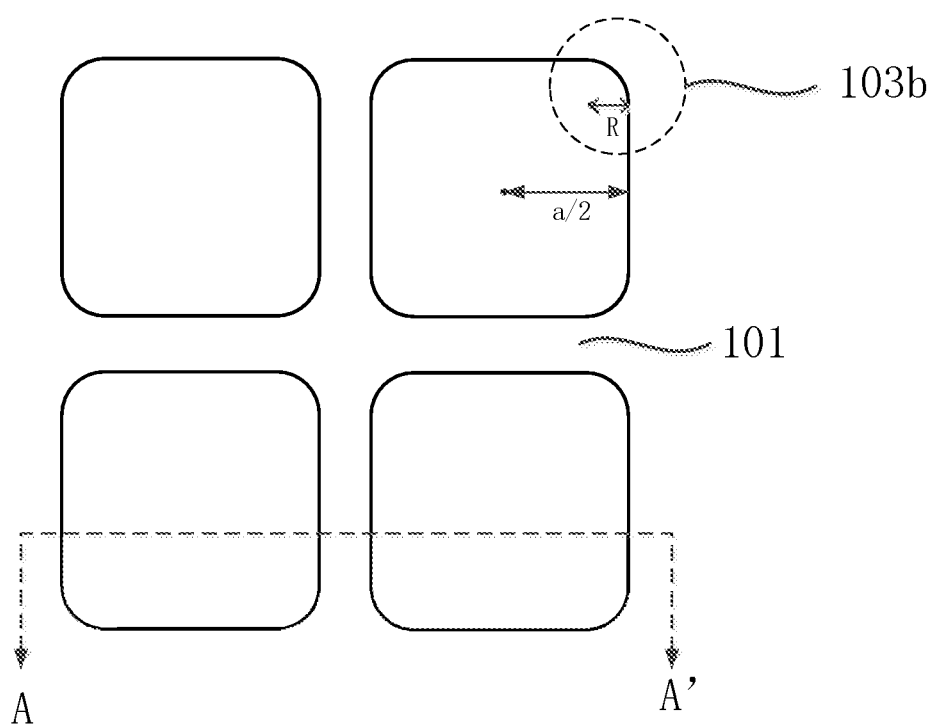

Optionally, FIG. 6A and FIG. 6B respectively are schematic diagrams of two quadrilateral regions according to the embodiments of the present disclosure. As shown in FIG. 6A, the quadrilateral region 103 has a chamfer 103a which may have an angle of 45°. In the embodiments of the present disclosure, when the touch electrode is formed, the electrode material solution drips at the intersection region and enters into the groove, and the dripping touch electrode solution flows from the intersection region to the extension region of the groove. The chamfer 103a of the quadrilateral region 103 reduces a resistance of the touch electrode droplets flowing from the intersection region of the groove to the extension region, which facilitates the rapid flow of the droplets of the touch electrode solution from the intersection region to the extension region. Particularly, the design of the chamber having an angle of 45° can allow the electrode material solution flowing to the first direction and the second direction to have the same fluid resistance component, so that the electrode material solution flowing to the first direction and the second direction may have the same flow velocity, thus facilitating the fabricating process of the touch electrode.

As shown in FIG. 6B, the quadrilateral region 103 has a fillet 103b and the radius R of fillet satisfies with: 0<R<a/2. The design of the fillet may reduce swirling of fluid at the crossover location of the grooves and reduce a liquid flow resistance.

Figure 7A:
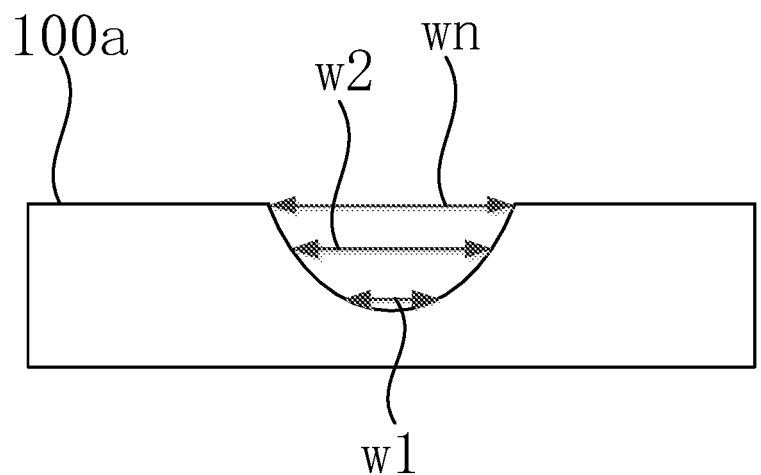
FIG. 7A is a schematic cross sectional diagram taken along AA' of FIG. 6B.

FIG. 7A is a schematic sectional diagram taken along AA of FIG. 6B. Referring to FIG. 7A, the groove has a plurality of groove widths w1, w2 . . . wn in a cross section, of the extension region of the groove, perpendicular to the extension direction of the groove. The plurality of groove widths gradually decrease from a direction perpendicularly pointing from the first surface 100a to the bottom of the groove, namely, w1<w2< . . . <wn. Such a setting pattern allows an inclination to be formed from the top of the groove to the bottom of the groove, so that the pressure of the side wall of the groove on the electrode material solution generates a component, a direct impact of fluid on the groove is reduced, thereby reducing a pressure difference resistance and effectively reducing the resistance of the fluid, quickening the flow of the electrode material solution and further facilitating spreading the electrode material solution in the groove.

Figure 7B:
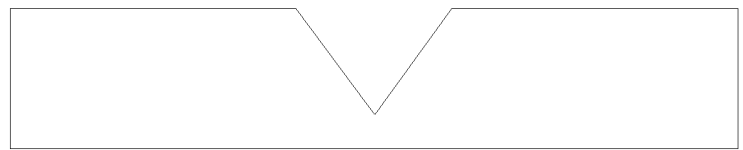
FIG. 7B~FIG. 7C are schematic diagrams of cross-sectional shapes of two types of grooves along AA' of FIG. 6B according to the embodiments of the present disclosure.
Figure 7C:
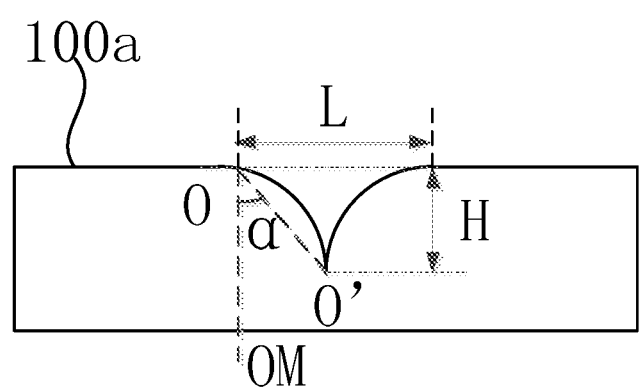

FIG. 7B~FIG. 7C are schematic diagrams of cross-section shapes of two grooves according to the embodiments of the present disclosure. Referring to FIG. 7B, in a cross section, of the extension region of the groove, perpendicular to the extension direction of the groove, the cross-section of the groove has a triangle shape. Referring to FIG. 7C, in a cross section, of the extension region of the groove, perpendicular to the extension direction of the groove, the cross-section of the groove has an arc shape. In the embodiments of FIG. 7B and FIG. 7C, the plurality of groove widths gradually decrease to 0, that is, the bottom of the groove is not a plane. At this moment, the pressure difference resistance of the side wall of the groove on the liquid flowing inside the groove is the minimum.

Continuing referring to FIG. 7C, the maximum vertical distance from the first surface 100a to the bottom of the groove is H. A first intersection point O is provided between the cross section, of the groove, perpendicular to the extension direction of the groove and the first surface 100a. An inclination α between a connecting line OO' from the first intersection point O to the bottom of the groove and a straight line OM passing through the first intersection point O and being perpendicular to the first surface 100a, wherein 0<L/H<1, 30°<α<60°.

The angle α represents an inclined degree of the side wall of the groove toward the bottom of the groove, and a ratio of L/H represents an extending degree of the groove toward the bottom under a condition that the side wall of the groove is in a specific inclined degree. It is found by research that a velocity gradient of the fluid flowing in the groove gradually decreases with the increase of a depth of the groove. Therefore, when the depth of the groove is greater than a width of the opening of the top surface of the groove, under the condition of 30°<α<60°, a viscous resistance between the liquid and a contact surface of the wall of the groove can be effectively decreased.

Figure 8:
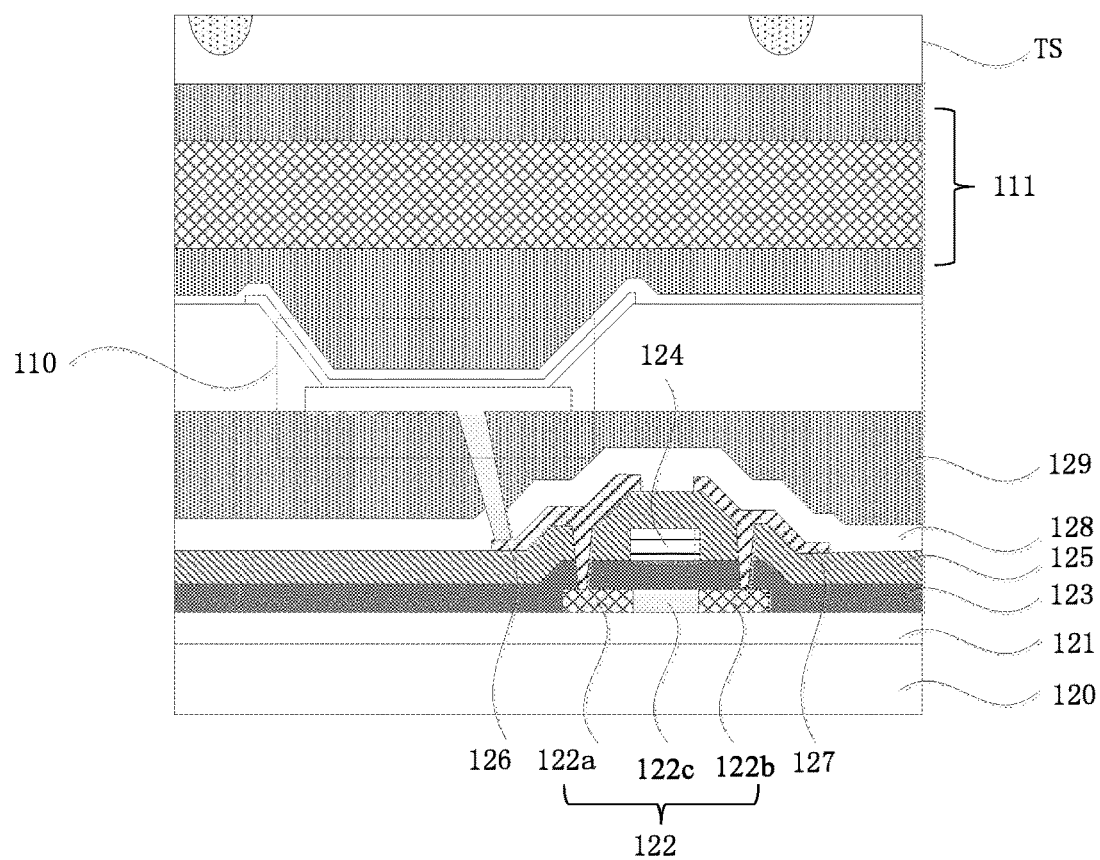
FIG. 8 is a touch display panel according to an embodiment of the present disclosure.

FIG. 8 is a touch display panel according to an embodiment of the present disclosure, which includes any one of the foregoing touch sensors. The touch display panel may be an organic light emitting display panel, including an organic light-emitting device 110 and a thin-film encapsulation layer 111 covering the organic light-emitting device 110. The touch sensor TS is directly formed on the surface of the thin-film encapsulation layer 111.

The touch display panel provided by this embodiment may be an organic light-emitting diode display panel. The touch display panel includes a substrate 120, which may be a flexible substrate. The flexible substrate may be formed by any suitable insulating material having flexibility. For example, the flexible substrate may be formed by polymer materials such as polyimide (PI), polycarbonate (PC), polyethersulfone (PES), polyethylene terephthalate (PET), polyethylene naphthalene (PEN), polyarylate (PAR) or glass fiber reinforced plastic (FRP). The flexible substrate may be transparent, semitransparent or nontransparent. The flexible substrate allows the touch display panel to implement flexible display such as bending, curling and folding.

A buffer layer 121 is positioned on the flexible substrate. The buffer layer 121 may cover the whole upper surface of the flexible substrate. In an embodiment, the buffer layer includes an inorganic layer or an organic layer. For example, the buffer layer may be formed by materials selected from inorganic materials such as silicon oxide ($SiO_x$), silicon nitride ($SiN_x$), silicon oxynitride ($SiO_xN_y$), aluminium oxide ($AlO_x$) or aluminum nitride ($AlN_x$) or from organic materials such as acrylm polyimide (PI) or polyester. The buffer layer 121 may include a single layer or a plurality of layers. The buffer layer obstructs oxygen and moisture, prevents moisture or impurities from diffusing through the flexible substrate, and provides a flat surface on the upper surface of the flexible substrate.

A thin film transistor (TFT) is positioned on the buffer layer 121. In the embodiments of the present disclosure, reference is made to the structure by taking a top-gate TFT as an example.

The TFT includes a semiconductor active layer 122 positioned on the buffer layer 121. The semiconductor active layer 122 includes a source region 122a and a drain region 122b formed by doping with N-type impurity ions or P-type impurity ions. A region between the source region 122a and the drain region 122b is a channel region 122c without doping with impurities.

The semiconductor active layer 122 may be formed by means of crystallization of amorphous silicon so that the amorphous silicon is transformed into polysilicon.

Various methods may be used to crystallize the amorphous silicon, for example, rapid thermal annealing (RTA), solid phase crystallization (SPC), excimer laser annealing (ELA), metal induced crystallization (MIC), metal induced lateral crystallization (MILC), or sequential lateral solidification (SLS), etc.

A gate insulation layer 123 includes an inorganic layer such as silicon oxide, silicon nitride or metal oxide, and may include a single layer or a plurality of layers.

A gate electrode 124 is positioned in a particular region on the gate insulation layer 123. The gate electrode 124 may include a single layer or a plurality of layers of gold (Au), silver (Ag), copper (Cu), nickel (Ni), platinum (Pt), palladium (Pd), aluminum (Al), molybdenum (Mo) or chromium (Cr), or alloy such as aluminum (Al)-neodymium (Nd) alloy or molybdenum (Mo)-tungsten (W) alloy.

An interlayer insulating layer 125 is positioned on the gate electrode 124. The interlayer insulating layer 125 may be formed by an insulating inorganic layer of silicon oxide or silicon nitride. Optionally, the interlayer insulating layer may be formed by an insulating organic layer.

A source electrode 126 and a drain electrode 127 are positioned on the interlayer insulating layer 125. The source electrode 126 and the drain electrode 127 are electrically connected (or coupled) to the source region or the drain region respectively via a contact hole. The contact hole is formed by selectively removing the gate insulation layer and the interlayer insulating layer.

A passivation layer 128 is positioned on the source electrode and the drain electrode. The passivation layer 128 may be formed by an inorganic layer of silicon oxide or silicon nitride or an organic layer.

A planarization layer 129 is positioned on the passivation layer 128. The planarization layer 129 includes an organic layer of acryl, polyimide (PI) or benzocyclobutene (BCB). The planarization layer 129 has a function of planarization.

An organic light-emitting device is formed on the TFT.

A thin-film encapsulation layer is positioned on the organic light-emitting device. In an embodiment, the thin-film encapsulation layer protects a light-emitting layer and other thin layers from external moisture and oxygen, etc.

Generally, the touch sensor directly formed inside the touch display panel is formed by means of evaporation and etching. These processes include a wet process such as cleaning. The thin-film encapsulation layer is required to have excellent performance in obstructing water vapor and oxygen so that the wet process is ensured not to have a negative effect on the organic light-emitting device inside the thin-film encapsulation layer, which undoubtedly has high process difficulty. The structure of the touch sensor TS provided by the present disclosure may be formed by means of inkjet printing. Therefore, when the touch sensor TS is directly formed on the surface of the thin-film encapsulation layer, no negative effect may be caused to the light-emitting element layer, thereby reducing requirements for the encapsulation performance of the thin-film encapsulation layer. The touch sensor TS has a substrate including a plurality of strip-shaped grooves. The substrate includes a first surface and a second surface opposite to the first surface. The plurality of grooves are intersected to define a grid shape. The plurality of grooves includes intersection regions formed by intersecting the plurality of grooves and an extension region positioned adjacent to the intersection region in the groove. The vertical distance of the bottom of the groove from the intersection region to the second surface is greater than that of the bottom of the groove from the extension region to the second surface. The bottom of the groove is within the first surface. The touch electrode is formed inside the groove by way of inkjet printing. Before being jetted and printed into the groove, the electrode material of the touch electrode is dissolved into a solvent to form electrode material solution. The electrode material solution drips at the intersection region and flows to the extension region under the action of gravity because the vertical distance from the intersection region to the second surface is greater than that from the extension region to the second surface. Therefore, fluidity and spreadability of the electrode material solution inside the groove are enhanced, and the formed touch electrode has good process stability. The touch electrode is formed inside the groove and the surface of the touch sensor TS has good flatness, which provides favorable conditions for subsequent film layer preparation processes of the touch display panel. The substrate has a plurality of grooves, which enhances the bending resistance of the touch sensor and is advantageous to flexible display of the touch display panel.

Generally, metallic materials are selected for the touch electrode. In the embodiments of the present disclosure, by directly forming the touch sensor TS having the above structure on the surface of the thin-film encapsulation layer, the overall thickness of the touch display panel can be reduced, and integration of the display panel and the touch sensor can be implemented. The touch sensor TS formed on the thin-film encapsulation layer is positioned between a circular polarizer and the light-emitting element layer of the touch display panel, which can reduce reflection of external environment light on the metal touch electrode and reduce the phenomenon of graphical visibility.

Figure 9:
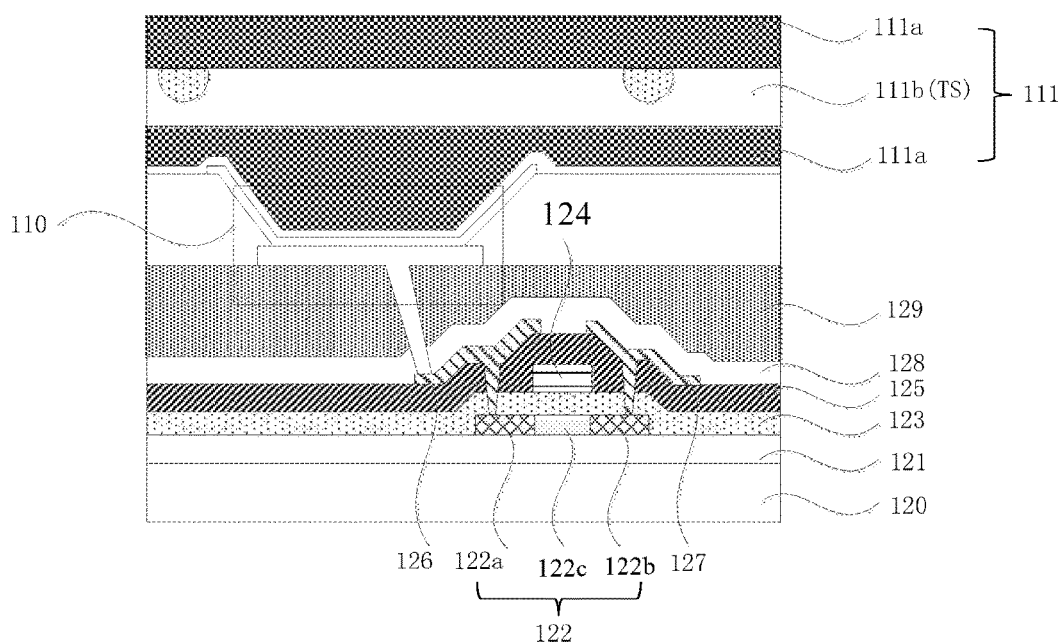
FIG. 9 is another touch display panel according to an embodiment of the present disclosure.

FIG. 9 is another touch display panel according to an embodiment of the present disclosure. Different from the embodiment as shown in FIG. 8, the thin-film encapsulation layer 111 includes at least one organic layer 111a and at least two inorganic layers 111b. The organic layer 111a is positioned between the two inorganic layers 111b. The substrate of the touch sensor TS is the organic layer 111a. In the embodiment of the present disclosure, the touch electrode is disposed inside the thin-film encapsulation layer, and the organic layer is also used as the substrate of the touch sensor. On one hand, corrosion of external water vapor and oxygen on the touch electrode may be avoided, and on the other hand, the thickness of the touch display panel may be furthest reduced, which conforms to the development trend to light weight and slim design. The touch electrode is disposed inside the first groove of an organic layer of the thin-film encapsulation layer. Therefore, the risk of fracture of the touch electrode in the process of bending may be significantly reduced.

Figure 10:
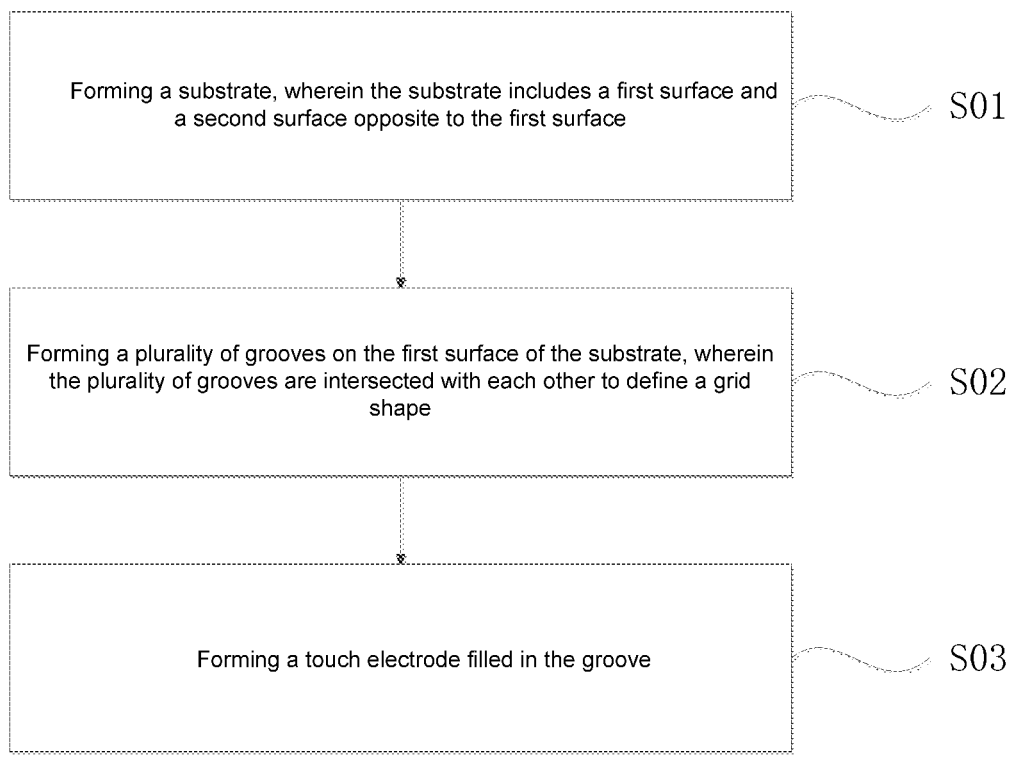
FIG. 10 is a schematic flowchart of a method for fabricating a touch sensor according to an embodiment of the present disclosure.

The present disclosure further provides a method for fabricating a touch sensor. FIG. 10 is a schematic flowchart of a method for fabricating a touch sensor according to an embodiment of the present disclosure. as shown in FIG. 10, the fabricating method includes:

S01: forming a substrate, wherein the substrate includes a first surface and a second surface opposite to the first surface;

S02: forming a plurality of grooves on the first surface of the substrate, wherein the plurality of grooves intersect with each other to define a grid shape;

the plurality of grooves includes intersection regions formed by intersect a plurality of grooves and extension regions beyond the intersection region, a vertical distance of a bottom of the groove from the intersection region to the second surface is greater than that of the bottom of the groove from the extension region to the second surface;

the bottom of the groove is within the first surface; and

S03: forming a touch electrode, where the touch electrode is filled in the groove.

In Steps S01 and S02, the substrate and the grooves on the substrate surface may be formed at the same time by means of inkjet printing. The material of the substrate is dissolved into a solvent to form ink droplet solution of the substrate, the ink droplet solution is jetted and the jetted ink droplet solution is cured. In this way, the substrate and the grooves are formed. The shape and the depth of the formed groove may be controlled by controlling an ink droplet size of the jetted ink droplet solution and the curing time of the ink droplet solution. Using the inkjet printing can freely and flexibly control the thickness of the formed substrate, the shapes of the grooves, a pitch of the grooves and the like. The substrate may be formed by one-shot process without multi-step processes such as evaporation and etching. Optionally, in the process of forming the inclined portion in the intersection region, the inclined portion and the grooves may be simultaneously formed, or the inclined portion may be further formed by the inkjet printing process after the grooves are formed.

In Step S03, the step of forming the touch electrode includes: dissolving the material of the touch electrode into the organic solvent to form electrode material solution of the touch electrode, and jetting the electrode material solution into the groove by way of inkjet printing.

Generally, the touch electrode of the touch sensor is directly formed on the surface of the substrate of the touch sensor. The material of the touch electrode includes transparent indium tin oxide. However, in a flexible display panel, a metal grid electrode having good flexibleness and low impedance may be used so as to enhance the bending resistance of the touch electrode. The fabricating process of the metal grid may adopt a technique of screen printing directly using metal ink. Alternatively, the entire metal may be coated on the substrate thin film and then redundant components are washed away via a yellow light photolithography process to generate the grid. No matter which technique is used, the above techniques may cause a negative impact on the light-emitting element if the metal grid electrode is directly formed inside the organic light emitting display panel.

In the embodiment of the present disclosure, the touch electrode is formed inside the groove on the substrate by means of inkjet printing. The groove may be a strip-shaped groove. And a plurality of strip-shaped grooves intercross to form a grid shape. The number of intercrossed grooves and the shape of the grid formed by intercrossing depend on the shape of the touch electrode used for touch position detection. The electrode material of the touch electrode may be metal, and optionally may be metallic materials such as gold, silver or copper, etc. The organic solvent is one of: ethyl cellulose, cellulose nitrate, polyvinyl acetate, ketone resin and polyamide resin. The electrode material of the touch electrode is dissolved into to the organic solvent to form the electrode material solution of the touch electrode, then the electrode material solution is jetted and printed into the groove of the substrate. The electrode material solution may be jetted and printed at the intersection region of the groove so that liquid flowing into the groove rapidly flows along the inner wall of the groove to form a uniform electrode shape, which is then cured, and the organic solvent vaporizes. In this way, the touch electrode is formed. For the groove formed in the embodiments of the present disclosure, the distance of the bottom of the groove from the intersection region to the second surface is greater than that of the bottom of the groove from the extension region to the second surface. Such a setting pattern may enhance a fluidity of the touch electrode material solution in the groove when the touch electrode is formed by way of inkjet printing, ensure the touch electrode to be formed evenly and stably, implement a better control of forming of the touch electrode, reduce a difficulty in fabricating the touch electrode, enhance a process stability of the touch electrode, allow the touch electrode to be evenly spread in the groove, and greatly reduce a possibility of disconnection of the touch electrode, thereby improving a touch reliability of the touch electrode.

It is noted that the foregoing embodiments are merely preferred embodiments of the present invention and technical principles used thereby. Persons skilled in the art may understand that the present invention is not limited to the specific embodiments described herein, and persons skilled in the art may make various obvious changes, readjustments and substitutions without departing from the scope of protection of the present invention. Therefore, although reference is made to the present invention in more detail in the foregoing embodiments, the present invention is not merely limited to the foregoing embodiments, and other more equivalent embodiments may be further included without departing from the conception of the present invention, and the scope of the present invention depends on the scope of the appended claims.

What is claimed is:

1. A touch sensor, comprising:
a substrate and a touch electrode, wherein
the substrate comprises a first surface and a second surface opposite to the first surface, wherein the first surface of the substrate is provided with a plurality of strip-shaped grooves, and wherein the plurality of grooves intersect with each other to define a grid;
wherein the plurality of grooves comprises a plurality of intersection regions each having a first bottom and a plurality of extension regions each having a second bottom, wherein a vertical distance from the first bottom to the second surface is greater than a vertical distance from the second bottom to the second surface;
wherein the first and second bottoms of the plurality of grooves are between the first surface and the second surface; and
wherein the touch electrode is disposed inside of the plurality of grooves.

2. The touch sensor according to claim 1,
wherein the plurality of grooves further comprises a plurality of first grooves extending in a first direction and a plurality of second grooves extending in a second direction, wherein the plurality of first grooves intersect with the plurality of second grooves to define a plurality of quadrilateral regions, wherein each of the plurality of quadrilateral regions has a first width in the first direction and a second width in the second direction, wherein a first distance is provided between the adjacent quadrilateral regions on the first surface in the first direction, and a second distance is provided between the adjacent quadrilateral regions on the first surface in the second direction.

3. The touch sensor according to claim 2, wherein
both the first width and the second width are equal to a; and
both the first distance and the second distance are equal to L.

4. The touch sensor according to claim 3, wherein
a bottom of an intersection region of one of the plurality of first grooves and one of the plurality of second grooves, protrudes toward the first surface,
wherein the protrusion has an inclined portion extending toward the extension regions of the first groove and the second groove, and wherein a height of the inclined portion gradually decreases from the intersection region to the extension regions.

5. The touch sensor according to claim 4, wherein
the protrusion has four inclined portions, which respectively extend toward two ends of the first groove toward two ends of the second groove.

6. The touch sensor according to claim 5, wherein
in both the first direction and the second direction, a cross-section of each of the inclined portions perpendicular to the first surface has a triangle shape, a trapezoid shape or an arc shape.

7. The touch sensor according to claim 5, wherein
a total length in the first direction of two inclined portions extending along one of the plurality of the first grooves is less than or equal to a sum of the first width and the first distance; and
a total length in the second direction of two inclined portions extending along one of the plurality of the second grooves is less than or equal to a sum of the second width and the second distance.

8. The touch sensor according to claim 3, wherein
the plurality of quadrilateral regions each has a chamfer.

9. The touch sensor according to claim 8, wherein
the chamfer has an angle of 45°.

10. The touch sensor according to claim 3, wherein
the plurality of quadrilateral regions each has a fillet.

11. The touch sensor according to claim 10, wherein
a radius R of the fillet satisfies with $0 < R < a/2$.

12. The touch sensor according to claim 4, wherein both the first and the second grooves are wider at top than at bottom in the extension regions.

13. The touch sensor according to claim 12, wherein
in the extension regions, the cross section of the first or the second groove has an arc or a triangle shape.

14. The touch sensor according to claim 12, wherein
in the extension region of the first or the second grooves, the groove's width L and the depth H satisfy a relationship:

$$0 < L/H < 1.$$

15. The touch sensor according to claim 12, wherein
one of the inclined portions has a varying distance h lower than the first surface and
$0 \leq h \leq H/2$, and wherein the cross section of the inclined portion has a slope which forms an angle β smaller than $\arctan(2(H-h)/(a+L))$, wherein L is the groove's width and H is the groove's depth and a is equal to the value of the first width and the second width.

16. A touch display panel comprising a touch sensor according to claim 1, wherein
the touch sensor comprises a substrate and a touch electrode, wherein the substrate comprises a first surface and a second surface opposite to the first surface, wherein the first surface of the substrate is provided with a plurality of strip-shaped grooves, and wherein the plurality of grooves intersect with each other to define a grid; wherein the plurality of grooves comprises a plurality of intersection regions each having a first bottom and a plurality of extension regions each having a second bottom, wherein a vertical distance from the first bottom to the second surface is greater than a vertical distance from the second bottom to the second surface; wherein the first and second bottoms of the plurality of grooves are between the first surface and the second surface; and wherein the touch electrode is disposed inside of the plurality of grooves, and
the touch display panel further comprises an organic light-emitting device and a thin-film encapsulation layer covering the organic light-emitting device, and the touch sensor is directly formed on a surface of the thin-film encapsulation layer.

17. The touch display panel according to claim 16, wherein
the touch display panel further comprises an organic light-emitting device and a thin-film encapsulation layer covering the organic light-emitting device, the thin-film encapsulation layer comprises at least one organic layer and at least two inorganic layers, and the organic layer is positioned between the two inorganic layers; and
the substrate of the touch sensor is the organic layer.

* * * * *